United States Patent
Xia et al.

(10) Patent No.: US 9,673,374 B2
(45) Date of Patent: Jun. 6, 2017

(54) COST-EFFECTIVE SINGLE CRYSTAL MULTI-STAKE ACTUATOR AND METHOD OF MANUFACTURE

(71) Applicant: Microfine Materials Technologies Pty Ltd, Singapore (SG)

(72) Inventors: Yuexue Xia, Singapore (SG); Huilin Nelly Goh, Singapore (SG); Dian-Hua Lin, Singapore (SG)

(73) Assignee: MICROFINE MATERIALS TECHNOLOGIES PTY LTD, Singapore (SG)

( * ) Notice: Subject to any disclaimer, the term of this patent is extended or adjusted under 35 U.S.C. 154(b) by 367 days.

(21) Appl. No.: 14/370,051

(22) PCT Filed: Dec. 31, 2012

(86) PCT No.: PCT/SG2012/000493
§ 371 (c)(1),
(2) Date: Jun. 30, 2014

(87) PCT Pub. No.: WO2013/100860
PCT Pub. Date: Jul. 4, 2013

(65) Prior Publication Data
US 2014/0354116 A1    Dec. 4, 2014

(30) Foreign Application Priority Data

Dec. 30, 2011  (SG) .............................. 201109781-3
Jun. 28, 2012  (SG) .............................. 201204837-7

(51) Int. Cl.
*H01L 41/09*    (2006.01)
*B81B 3/00*    (2006.01)
(Continued)

(52) U.S. Cl.
CPC ................ *H01L 41/09* (2013.01); *B81B 3/00* (2013.01); *H01L 41/0926* (2013.01);
(Continued)

(58) Field of Classification Search
CPC ...... G10K 11/32; H04R 17/00; H03H 9/0595; H03H 9/19; H03H 9/132; H01L 41/0913
(Continued)

(56) References Cited

U.S. PATENT DOCUMENTS 2,439,499 A * 4/1948 Williams .................. G04C 3/12
                                                        310/26
2,955,216 A * 10/1960 Dieter, Jr. ............... H01L 41/08
                                                        310/330
(Continued)

FOREIGN PATENT DOCUMENTS

CN    101294844    10/2008
JP    2001322286 A    11/2001
(Continued)

OTHER PUBLICATIONS

Extended European Search Report, dated Oct. 9, 2015, European Application No. 12862083.8.
(Continued)

*Primary Examiner* — Thomas Dougherty
(74) *Attorney, Agent, or Firm* — Blakely Sokoloff Taylor & Zafman LLP

(57) ABSTRACT

This invention pertains to piezoelectric actuators made of single crystal active elements which not only exhibit uniform and superior displacement in the axial direction but also of lower cost to produce than full single crystal ring or tube actuators. Said multi-stake actuator is made up of multiple longitudinal (d33) or transverse (d3i or d32) mode piezoelectric single crystal active elements, bonded together by epoxy with the aid of shaped edge- and top and bottom
(Continued)

washer-stiffeners which are configured to suit various application needs.

11 Claims, 7 Drawing Sheets

(51) Int. Cl.
  *H01L 41/18*     (2006.01)
  *H01L 41/25*     (2013.01)
  *H01L 41/293*    (2013.01)
(52) U.S. Cl.
  CPC ...... *H01L 41/0966* (2013.01); *H01L 41/0986* (2013.01); *H01L 41/18* (2013.01); *H01L 41/25* (2013.01); *H01L 41/293* (2013.01)
(58) Field of Classification Search
  USPC .................................. 310/311–371, 367–369
  See application file for complete search history.

(56) References Cited

U.S. PATENT DOCUMENTS

| | | | | |
|---|---|---|---|---|
| 4,523,120 A | * | 6/1985 | Assard | ................ H01L 41/0993 310/317 |
| 5,081,391 A | | 1/1992 | Owen | |
| 6,020,674 A | * | 2/2000 | Zhang | ................ H01L 41/0993 310/333 |
| 7,795,782 B2 | * | 9/2010 | Wischnewskij | ....... H02N 2/163 310/323.01 |
| 8,915,139 B1 | * | 12/2014 | McConnell | ......... G01P 15/0922 73/514.34 |
| 2002/0036282 A1 | | 3/2002 | Chiang et al. | |

FOREIGN PATENT DOCUMENTS

| | | |
|---|---|---|
| JP | 2006510222 A | 3/2006 |
| JP | 2007055021 A | 3/2007 |
| JP | 2007330036 A | 12/2007 |
| JP | 2007336685 A | 12/2007 |

OTHER PUBLICATIONS

Moffet, M.B. et al., Single-crystal lead magnesium niobate-lead titanate (PMN/PT) as a broadband high power transduction material:, Journal of the Acoustical Society of America, vol. 121, pp. 22591-22599, May 2007.
Robinson et al., "Single crystal free-flooded ring transducer", present at 2010 US Navy Workshop on Acoustic Transduciton Materials & Devices: (Abstract No. IV.1) (2010).
Rehrig et al., "Naval Device applications of relaxor piezoelectric single crystals" in Proceedings of 2002 IEEE Ultrasonics Symposium pp. 733-737 (2002).
Office Action in Japanese Application No. 2014-550243 mailed Sep. 27, 2016, with English translation. 20 pages.

* cited by examiner

COST-EFFECTIVE SINGLE CRYSTAL MULTI-STAKE ACTUATOR AND METHOD OF MANUFACTURE

TECHNICAL FIELD

The present invention relates to a cost effective single crystal multi-stake actuator and a method of manufacture.

BACKGROUND OF THE INVENTION

Longitudinal ($d_{33}$) mode stacked and transverse ($d_{31}$) mode tube or cylinder actuators are widely used piezoelectric actuators when high generative forces are required. These actuators work fine for isotropic materials, such as lead zirconate titanate ($Pb[Zr_{1-x}Ti_x]O_3$ or PZT) piezo-ceramics.

To keep the applied voltage low, longitudinal ($d_{33}$) mode actuators are often made up of shorter disk, ring or plate-like segments of a few mm or smaller in thickness bonded together into a stack via a suitable means.

In recent years, lead zinc niobate-lead titanate ($Pb[Zn_{1/3}Nb_{2/3}]O_3$—$PbTiO_3$ or PZN-PT), lead magnesium niobate-lead titanate ($Pb[Mg_{1/3}Nb_{2/3}]O_3$—$PbTiO_3$ PMN-PT) and lead magnesium niobate-lead zirconate titanate (PMN-PZT) solid solution piezoelectric single crystals and their doped and/or modified ternary and quaternary derivatives have been investigated extensively. These new piezoelectric materials exhibit superior electro-mechanical properties to PZT ceramics.

Piezoelectric single crystals are anisotropic materials which exhibit different properties when poled and/or activated in different crystal directions.

For instance, for a [001]-poled longitudinal ($d_{33}$) mode single crystal ring, while it exhibits fairly uniform longitudinal strain and sound velocity in the axial direction across the top and bottom faces, its strains and sound velocities vary with different radial directions. As a result, a short single crystal ring often exhibits complex coupled resonant behavior and may not be suitable for operating in resonant mode.

Reference made to Journal of the Acoustical Society of America, vol. 121, pp. 2591-2599 (2007) entitled "Single-crystal lead magnesium niobate-lead titanate (PMN/PT) as a broadband high power transduction material", by Moffett et al. wherein a single crystal cylinder projector made up of 9 segmented-rings stacked and bonded on top of one another, each ring being a dodecagon of 12 beveled $d_{33}$-mode single crystal plates is disclosed.

Reference made to "Single crystal free-flooded ring transducer", presented at 2010 U.S. Navy Workshop on Acoustic Transduction Materials and Devices, May 11-13, State College, Pa., USA. (Abstract No. IV.1) (2010) by Robinson et al. [22] wherein a hybrid transducer in which wedge-shaped spacers made of alumina were used as bonding guides and stiffeners to bond rectangular $d_{31}$-mode single crystal active elements into segmented rings which were then stacked and bonded together to form the cylinder projector is reported.

In the above two cited documents, the actuation mode of interest is the circumferential vibration or breathing mode of the ring or cylinder.

Single crystal tube actuators of transverse mode (either $d_{31}$ or $d_{32}$) also suffer from problems arising from crystal anisotropy. Such actuators typically have electrodes in the inner and outer surfaces of the tube and are poled in the radial direction. Since the radial directions of a single crystal tube constitute different crystal directions, when the single crystal tube is put into action with the applied electric field in the radial direction, non-uniform strains in the axial direction will be generated at both end faces of the tube. This is undesirable because the overall performance of the tube actuator is compromised by the radial segments exhibiting lower performance than expected.

Another major disadvantage of single crystal rings and tubes is that they have to be machined out from a block of crystal and the material wastage involved in such a process can be 50% or even higher. This increases the already high cost of production of piezoelectric single crystal further.

The machining of small-diameter single crystal tubes is especially troublesome which often results in high rejection rates. This is because the curved machined surfaces are not easy to dress by mechanical polishing to remove machining induced defects. These cracks, if not removed, may propagate during poling of the crystal. And, even if the actuator survives the poling process, the cracks may grow during use, leading to premature failure of the device.

Reference made to "Naval device applications of relaxor piezoelectric single crystals", in Proceedings of the 2002 IEEE Ultrasonics Symposium, pp. 733-737 (2002) by Rehrig et al wherein an underwater transducer driven by multiple single crystal blocks as the motor section was reported, in which no edge stiffeners was used. Such a design works fine when the single crystals active elements are short, thick and strong but would be problematic when the crystals are long and thin and the device is subject to bending and twisting as would be expected in typical application of most piezoelectric actuators.

It is, therefore, a motivation of the present invention to provide a multi-stake actuators made of single crystal active elements which obviates the drawback of the prior art.

OBJECT OF THE INVENTION

It is an object of present invention to provide a piezoelectric actuator made of single crystal active elements.

It is also an object of present invention to provide a piezoelectric actuator which not only exhibit uniform and superior displacement in the axial direction but also of lower cost to produce than full single crystal ring or tube actuators.

It is also an object of present invention to provide multi-stake actuators of various configurations including triangular, square, rectangular, hexagonal, octagonal and like.

It is a further object of present invention to provide a method of manufacturing such actuator.

These and other objects and advantages of the present invention will become apparent from the following description, taken in connection with the accompanying drawings, wherein, by way of illustration and example, at least one embodiment of the present invention is disclosed.

SUMMARY OF THE INVENTION

This invention concerns a range of multi-stake axial actuator of various configurations which remove problems associated with the anisotropic nature of single crystal rings and tubes and their high production cost while maintaining high axial displacement of the device. Said actuators are made of identical single crystal active elements of optimal compositions including but not limited to longitudinal ($d_{33}$) and transverse ($d_{31}$ or $d_{32}$) plates or bars of either [001]-poled or [011]-poled single crystals of lead zinc niobate-lead titanate (PZN-PT), lead magnesium niobate-lead titanate (PMN-PT), and/or lead magnesium niobate-lead zirconate titanate (PMN-PZT) solid solutions of rhombohedral, morphotropic phase boundary and adjacent tetragonal compositions and their doped and/or modified ternary and quaternary derivatives, and other suitably cut and poled crystals. Said single crystal active elements are bonded with appropriately shaped edge-stiffeners-cum-guides into the desired cross-section including triangular, square, rectangular, hexagonal, octagonal and other odd- and even-sided pseudo-ring polygon designs. Alternatively, the inner corners of the crystals may be appropriately beveled to enable edge-stiffeners-cum-guides of reduced cross-sections to be used as well as to make the use of edge-stiffeners optional. End and intermediate washers may be used to further improve the bending and twisting strengths and robustness of the device. Said actuators are of lower production cost as vast material wastage during the machining of the ring and tube from a single crystal block is avoided.

DETAILED DESCRIPTION OF THE PRESENT INVENTION

Figure 1:
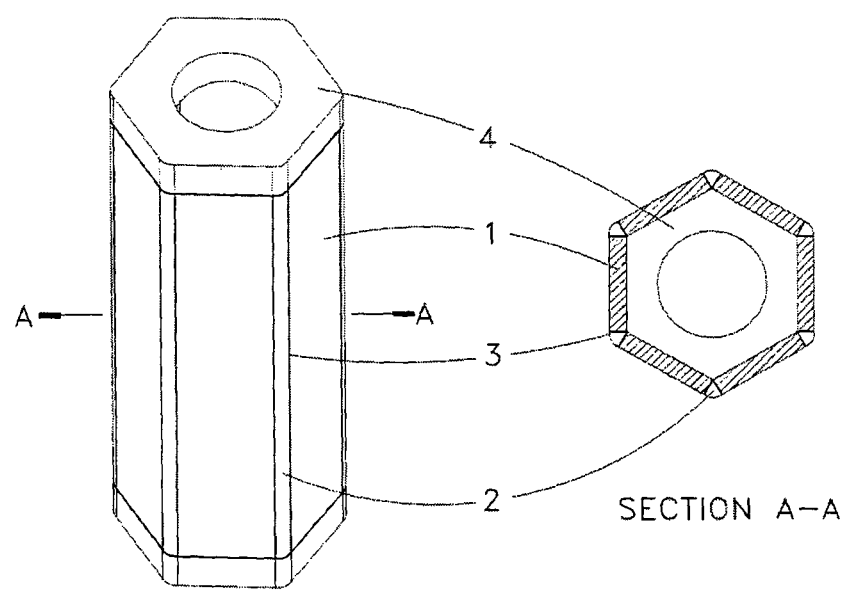
FIG. 1 shows a multi-stake actuator with a central hole made up of multiple longitudinal ($d_{33}$) or transverse ($d_{31}$ or $d_{32}$) mode piezoelectric single crystal active elements.

FIG. 1 shows the preferred embodiment of the present invention. A multi-stake actuator with a central hole made up of multiple longitudinal ($d_{33}$) or transverse ($d_{31}$ or $d_{32}$) mode piezoelectric single crystal active elements, bonded together by epoxy with the aid of shaped edge- and top and bottom washer-stiffeners is shown here. Wire leads connected to the electroded faces (both not shown in this and other figures) of the single crystal active elements are provided for actuation purposes. FIG. 1 shows a multi-stake actuator in which the stakes are identical piezoelectric single crystal active elements of suitable compositions and cuts (1). Said single crystal elements are bonded by epoxy with the aid of shaped edge-stiffeners (2) into the desired configurations and onto the shaped washer-stiffeners (4) at both ends. Lead wires are bonded onto the electroded faces of the crystals to complete the device (not shown in this and other figures). The bold lines denote epoxy joints (3). The term "Epoxy" is a well-understood generic term and used herein to define epoxy-based adhesive joints which include a whole range of suitable epoxies produced by various manufacturers. It is like "steel", "aluminium", etc.

Examples of crystal cuts suitable for making such devices include both longitudinal ($d_{33}$) and transverse ($d_{31}$ or $d_{32}$) plates or bars of either [001]-poled or [011]-poled single crystals of lead zinc niobate-lead titanate (PZN-PT), lead magnesium niobate-lead titanate (PMN-PT), and/or lead magnesium niobate-lead zirconate titanate (PMN-PZT) solid solutions of rhombohedral, morphotropic phase boundary and adjacent tetragonal compositions and their doped and/or modified ternary and quaternary derivatives, and other suitably cut and poled crystals.

Figure 2:
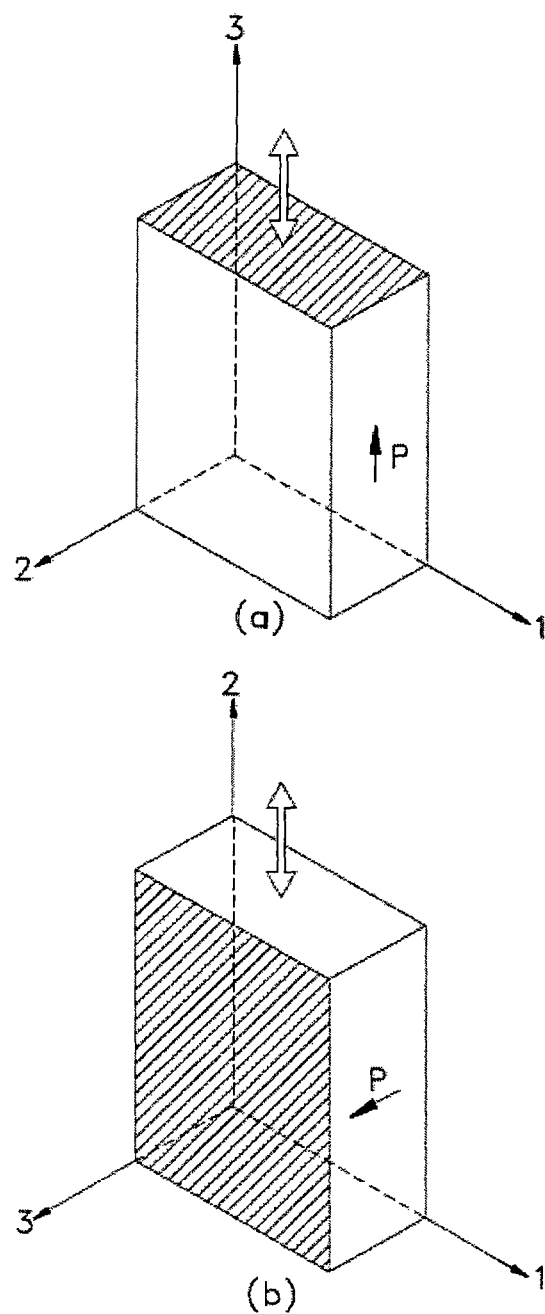
FIG. 2 (prior art) shows schematics of the geometry of longitudinal ($d_{33}$) and transverse ($d_{31}$ or $d_{32}$) mode single crystals.

FIG. 2 (prior art) shows schematics of the geometry of longitudinal ($d_{33}$) and transverse ($d_{31}$ or $d_{32}$) mode single crystals. The shaded and the opposite faces are electroded faces. Thin single-headed arrows indicate the poling direction used in preparing the crystals and thick double-headed arrows the activated direction of the crystal during use. Conventionally, the poling direction is also taken as the 3-direction.

Longitudinal ($d_{33}$) cut crystals are rectangular crystals which are poled and activated in the same 3-direction of the crystal. The active direction and poling direction are thus parallel to one another in such crystals, as shown schematically in FIG. 2(*a*).

In forming the multi-stake actuator using longitudinal ($d_{33}$) mode crystals, the poling (3-) direction is laid parallel to the axial direction of the actuator with the electroded faces in contact with the top, bottom and/or intermediate washers.

Transverse ($d_{31}$ or $d_{32}$) cut crystals are rectangular crystals which are poled in the 3-direction but the active direction is either in the 1- or 2-direction. The active direction is thus orthogonal to the poling direction in such crystals, as shown schematically in FIG. 2(*b*).

In forming the multi-stake actuator using transverse ($d_{31}$ or $d_{32}$) mode crystals, the 1- (or 2-) active direction of the crystal is laid parallel to the axial direction and the poling (3-) direction can be either along the radial or the circumferential direction of the actuator depending on the actual design.

Instead of individual crystals, each stake may be made up of a pair or a suitable number of crystals bonded back-to-back or in any suitable configuration to lower the driving voltage of the device.

Piezoelectric single crystals are brittle and may break easily when bent or twisted especially when they are long and thin. Configuring the single crystal active elements into various pseudo-ring polygon arrangements can be achieved via fully beveled single crystal plates or bars, as described in Moffett et al. This, however, is not recommended as the thin beveled edges are extremely fragile and tend to chip during handling and use.

Without beveling, bonding of individual rectangular single crystal active elements into the desired configuration with epoxy alone is always problematic. This is because the nature of the epoxy can change drastically from being very fluid to very viscous during its application and it shrinks considerably upon setting. The result is often a product with imperfect bonds and/or of distorted form.

The shaped edge-bonding-guide-cum-stiffeners and washer-stiffeners serve the following functions. Firstly, they are used to configure the actuators into the desired arrangement and hence cross-sections, including triangular, square, rectangular, hexagonal, octagonal, and other odd- and even-sided pseudo-ring polygon configurations. Secondly, they serve to control and minimize the amount of epoxy used in the bonding process. Thirdly, they act to improve the bending and twisting strengths and hence the robustness of the finished device.

Shaped edge-stiffeners are particularly useful when thin single crystals are used as the active elements, to provide the needed stiffening and strengthening to the otherwise fragile device. Preferably, they should span the entire active length of the crystals but disjointed design is also possible to make room for the bonding of lead wires between adjacent crystals or other desired functions.

Figure 3:
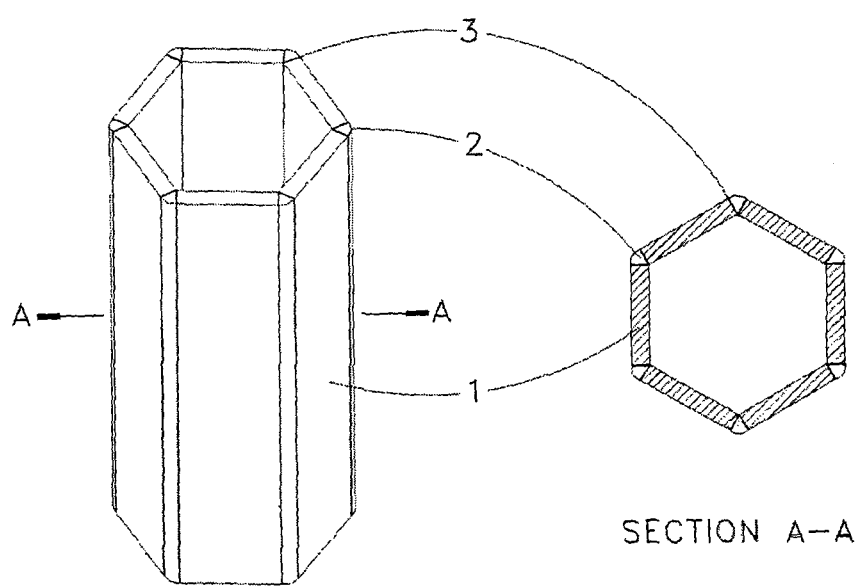
FIG. 3 shows a crystal assembly of hexagonal cross-section fabricated by bonding of rectangular crystals with epoxy (denoted by the bold lines) with the aid of edge-stiffeners-cum-guides.

An example of a hexagonal cross-sectioned crystal assembly produced by bonding suitable number of rectangular crystals (1) with epoxy and edge-stiffeners-cum-guides (2) is given in FIG. 3. Lead wires and shaped top and bottom washers is bonded onto the assembled crystals to complete the actuator. The bold lines denote epoxy joints (3).

In addition to the correct beveled angle, shaped edge-stiffeners may be of different configurations and designs to fulfill the following functions. On the one hand, they should be sufficiently stiff to serve as bonding guides during epoxy bonding to configure the single crystal active elements into the desired arrangement. On the other hand, as non-active materials, their cross-section and hence volume should be kept low such that they will not impose too much mechanical constraint to the axial activation of the single crystals which, in turn, could adversely affect the axial displacement of the resultant actuator.

Figure 4:
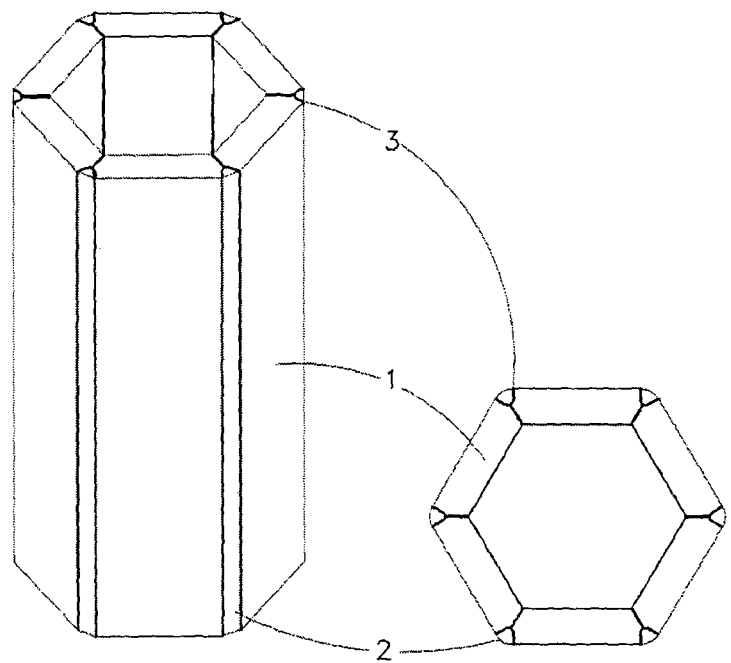
FIG. 4 shows a crystal assembly of hexagonal cross-section fabricated by bonding of appropriately beveled crystals bonded with epoxy (denoted by the bold lines) and edge-stiffeners-cum-guides of a reduced cross-section.

As shown in FIG. 4, partially beveled crystals (1) may be used to reduce the cross-section of the edge-stiffener-cum-guide (2). The bold lines denote epoxy joints (3). The use of edge-stiffener-cum-guide is optional when the beveled faces are sufficiently large to hold the crystals firmly in position upon bonding with epoxy.

The beveled faces should be applied to the inner corners of the crystals only. Fully beveled crystals are not preferred as the resultant acute outer corners would be fragile and could break easily during handling and use.

For sufficiently beveled crystals such that they are able to hold the desired configuration upon bonding of the beveled faces with epoxy, the use of the edge-stiffener-cum-guide is optional. Despite so, pre-machined edge-stiffener-cum-guide are useful to provide protection to the outer corners of the crystals, as shown in FIG. 4. Alternatively, the resultant seams in between bonded beveled crystals may be filled with viscous epoxy or other suitable mix which would harden to form the edge stiffeners and provide the needed protection to the crystal outer edges and corners.

In an embodiment of present invention, candidate materials for shaped edge-stiffeners vary from polymers of intermediate modulus and toughness to low modulus metals depending on the stiffness of the single crystal elements in the active direction. Example candidate materials for edge-stiffeners include polycarbonate, PMMA, bare and anodized aluminium, etc.

This is different from the wedge-shaped bonding guides and stiffeners used in the work of Robinson et al. These wedges are made of alumina which is very hard and stiff. In the said work, circumferential vibration mode of the ring or cylinder actuator is of interest. The wedges must thus be as stiff as possible not to adversely affect this vibration mode of the actuator.

In another embodiment, the washer-stiffeners, which contain a central hole, are shaped by machining or a suitable means into the desired configurations and dimensions. For instance, triangular-shaped washers are used for triangular-cross-sectioned multi-stake actuators, square-shaped washers for square-cross-sectioned multi-stake actuators, hexagonal- or octagonal-shaped washers and other polygons of either odd or even numbers of sides for pseudo-ring actuators.

In a preferred embodiment, the washers contain suitable templated recesses to serve as positioning guides for the crystals during the bonding stage.

Candidate materials for washer-stiffeners are inexpensive metals of moderate to high modulus and reasonable corrosion resistance which can be shaped easily by machining or any suitable and inexpensive means. Ceramic washer-stiffeners may also be used although not preferred because of their brittleness and cost.

When the metallic washers need to be electrically insulated from the crystals, materials whose surfaces can be treated to form an insulating surface layer or coating should be used.

Alternatively, a thin hard insulating layer, such as a thin glass sheet, may be bonded onto the underside of the washer to provide the said effect. The use of glass sheet also has the advantage that it can be easily templated using ultrasonic machining when so desired.

Depending on their locations in the actuator, the washers can be differentiated into end and intermediate washers, respectively.

End washers are bonded onto the top and bottom end-faces of the multi-stake actuator and function as load and stress equalizers as well as stiffeners for the resultant device.

Intermediate washers allow shorter crystals to be used in the fabrication of long actuators when a larger axial displacement is needed. The use of intermediate washers with short crystals reduces the risk of bending and twisting failure of the crystals significantly.

Figure 5:
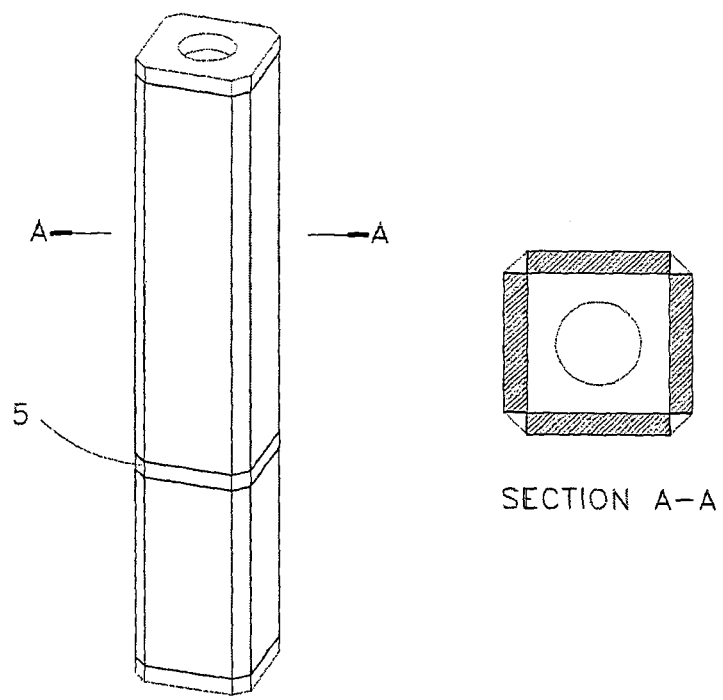
FIG. 5 shows a two-segment square-cross-sectioned multi-stake actuator with the use of a shaped intermediate washer.

An example of a multi-stack actuator with intermediate washers is provided in FIG. 5. This figure shows a two-segment square-cross-sectioned multi-stake actuator with only one intermediate washer-stiffener (5). Multiple units of intermediate washers may be used to suite various application needs. Intermediate washers enable the use of shorter single crystal active elements for improved bending and twisting strengths of the device and are particularly useful for long actuators when large axial displacement is required. A shorter lower segment is shown here which provides improved bending strength of the lower segment. Other variations including thicker active elements, larger number of active element, use of single crystal of other suitable composition, cut and dimensions, are possible to suit the application need.

Under dynamic condition and when bending of the active elements could not be totally avoided, the single crystal active elements may subject to different induced stresses and/or strains along its length and cross-section during use. The design and configuration of respective segments in a multi-segment actuator including the number and arrangement of the active elements, crystal composition, cut and dimension, may thus be varied to cater for different application needs.

An example of such is provided in FIG. 5, of which the active elements in the lower segment is shorter than those in the upper segment for improved bending strength of the lower segment. Alternatively, either crystal cut of higher bending strength, thicker active elements or a larger number of active elements may be used to fulfill said purpose.

The novel features of the present invention include: (a) Structurally, shaped edge-bonding-guide-cum-stiffeners are used to configure the single crystal elements into the desired arrangement and hence cross-sections, which also serve to control and minimize the amount of epoxy used in the bonding process and provides quality assurance to the device during fabrication, and, together with the washer-stiffeners, to improve the bending and twisting strengths and hence the robustness of the finished actuator. (b) Functionally, compared with commercial state-of-the-art piezoelectric actuators which are largely of stacked or bender designs, this invention provides (i) superior and uniform axial displacement (compared with stacked), (ii) good axial force with reasonable bending and twisting strengths (compared with benders) and (iii) reduced production cost (compared with single crystal rings and tubes).

To make multi-stake actuators, the single crystal active elements are first bonded with epoxy into the desired configuration using appropriately shaped edge-stiffeners as bonding guides. Additional bonding fixtures may be used to aid this bonding process to ensure that the end faces of all the crystals are aligned. After curing, both end faces of the bonded crystal group are dressed with care to ensure that they are flat and parallel when needed before they are bonded onto the recess-containing side of the top and bottom washers, respectively. For washers without pre-machined recesses, suitable bonding fixtures may be used instead.

The above fabrication steps may be reversed although this is not preferred. That is, with templated recesses in the washers as positioning guides, the single crystal active elements are bonded onto the end washer-stiffeners first. After curing, the shaped edge-stiffeners are then bonded into the longitudinal seams in between the crystals. Alternatively, the seams in between the crystals may be filled with viscous epoxy or other suitable mix which would harden to form the edge stiffeners.

Figure 6:
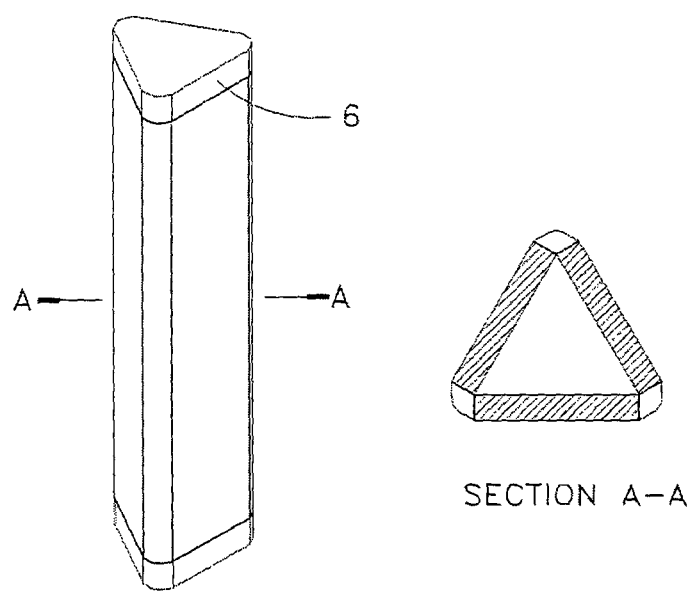
FIG. 6 shows a triangular-cross-sectioned multi-stake actuator with top and bottom cap-stiffeners instead of washer-stiffeners.

When the through central hole is not required, shaped end caps (with no central hole) instead of washers may be used. An illustration of a triangular-cross-sectioned stake actuator with solid end caps (6) is shown in FIG. 6.

A spherical, cylindrical or other suitably-shaped contact point may also be incorporated in the design of the end cap to help minimize bending stresses acting onto the single crystal active elements during use.

An appropriate pre-stress mechanism may also be incorporated in the design of the end caps and/or washers to load the single crystal active elements and the epoxy joints in compression to improve the reliability of the device.

Figure 7:
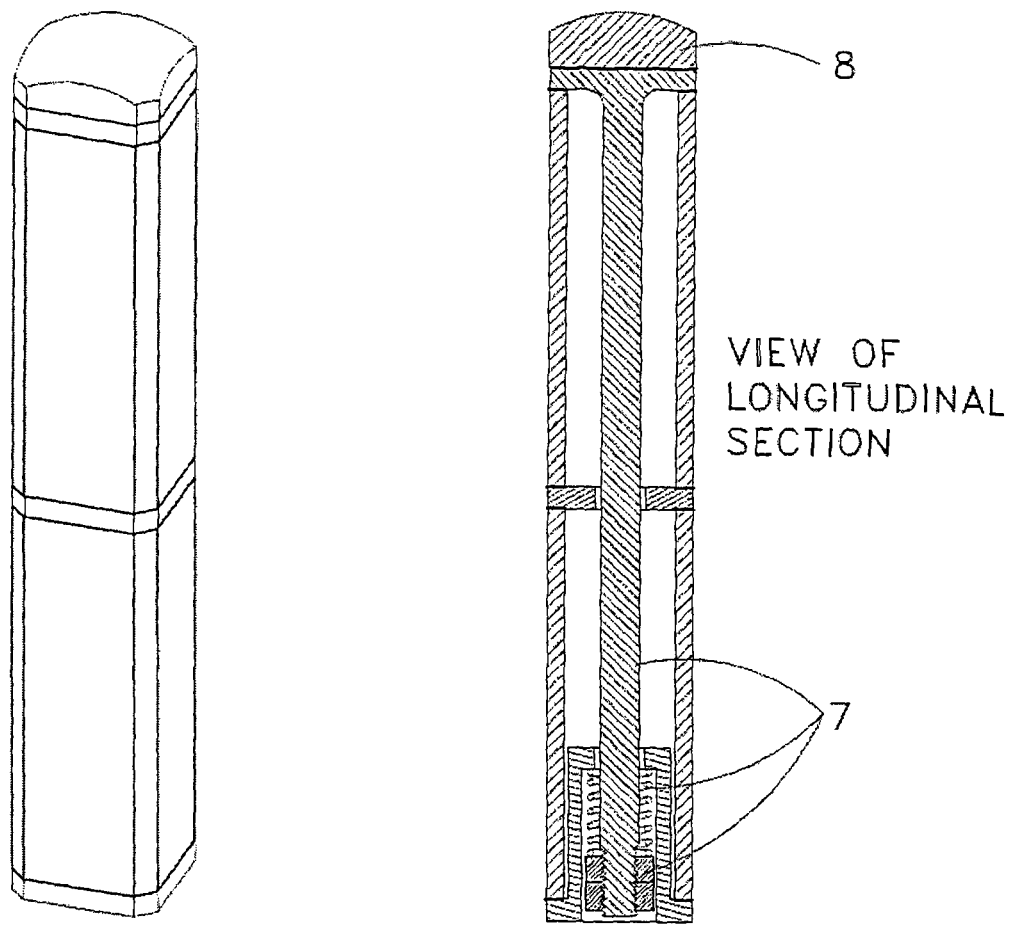
FIG. 7 shows a 2-segment multi-stake actuator incorporating a suitable pre-stress mechanism and a hard spherical contact point in its design.

FIG. 7 gives an example of a two-segment multi-stake actuator in which a suitable pre-stress mechanism (7) and a hard spherical contact point (8) have been incorporated in the design, to improve the reliability and durability of the device.

Multi-stake actuators of either rectangular or beveled crystals in the desired configuration can also be made with shaped edge-stiffeners alone, as shown in FIG. 3 and FIG. 4. However, the resultant actuators are rather fragile and should be protected by washers, end caps or similar stiffening end and intermediate pieces in any suitable form and shape which can be added in a subsequent operation.

Without both shaped washer- and edge-stiffeners, the bonding of individual single crystal active elements with epoxy alone is not only messy and time consuming but also often leads to bonded actuators of distorted form. Such a problem is especially pronounced when unbeveled single crystal elements are used.

Depending on the requirement, non-conductive and conductive epoxies are used selectively in bonding the various components described above to make the multi-stake actuators of the present embodiment.

High temperature curing epoxies should be used if the resultant actuator is meant for use at elevated temperature. The maximum curing temperature should be kept below the depolarization temperature of the single crystal used. Otherwise, repoling of the bonded single crystal active elements has to be carried out to restore the desired properties of the single crystals.

Lead wires connected to the electroded faces of the single crystal active elements are provided, which can be incorporated into the device at any appropriate fabrication stage. Care must be exercised such that neither full nor partial depoling of the single crystal active elements occur during the lead wire bonding process.

When the resultant device is meant as an axial displacement actuator, care must be exercised in bonding the lead wires as regard the polarity of the poled crystals such that all the single crystal active elements are driven in a consistent manner when connected to the same power supply, which can either be D.C. (direct current) or A.C. (alternative current) or their combination.

An alternative is to connect the lead wires such that when the actuator is powered with either a D.C. or an A.C. source, the single crystal active elements are activated in such a manner that the free end of the actuator would bend out of the axial direction when its other end is fixed onto a firmed support rendering the actuator to function as a bender. The term "benders" are well understood term for people in this field and herein refers to piezoelectric bender actuators.

Yet another alternative is to connect the lead wires such that when the actuator is powered with appropriate A.C. supplies of suitable phase shift, the single crystal active elements will be activated in synchronization such that one or both end faces of the actuator is set in continuous rotation bending motion suitable for positioning or piezoelectric motor application.

The multi-stake actuators of the present invention are sufficiently rigid and strong and can be handled and used as conventional stacked or tube piezoelectric actuators. One of the embodiment of present invention includes any derivative device in which at least one multi-stake actuator of present invention is used as a means of displacement actuation or as a means of bending actuation or as a means of rotation bending actuation. In another embodiment of the present invention a piezoelectric motor or micromotor in which a multi-stake actuator of present invention is used as a stator is disclosed.

It will be obvious to a skilled person that the configurations, dimensions, materials of choice of the present embodiment may be adapted, modified, refined or replaced with a slightly different but equivalent method without departing from the principal features of the working principle of our invention, and additional features may be added to enhance the performance and or reliability of the actuator. These substitutes, alternatives, modifications, or refinements are to be considered as falling within the scope and letter of the following claims.

ADVANTAGES OF THE PRESENT INVENTION

1) It provides piezoelectric actuator with uniform and superior displacement in the axial direction compared with conventional stacked actuator.
2) It provides actuator of robust construction with high axial force and reasonable bending and twisting strengths than conventional bender actuator.
3) It provides low production cost actuator compared with single crystal ring or tube.
4) It provides actuator of desired configurations to suit various application needs.

5) It provides a method and necessary steps to fabricate described actuator with consistent actuator performance.

We claim:

1. A multi-stake axial displacement actuator comprising:
   transverse ($d_{32}$ or $d_{31}$) and/or longitudinal ($d_{33}$) mode rectangular shaped piezoelectric single crystal active elements, each piezoelectric single crystal active element configured from a single crystal with lead wires and electrodes bonded onto its faces;
   edge stiffeners between the piezoelectric single crystal elements, the edge stiffeners spanning the length of each piezoelectric single crystal active element; and
   washer stiffeners shaped at both ends of the piezoelectric single crystal active elements;
   wherein said piezoelectric single crystal active elements are selected from a group consisting of solid solutions of lead zinc niobate-lead titanate ($Pb[Zn_{1/3}Nb_{2/3}]O_3$—$PbTiO_3$ or PZN-PT), lead magnesium niobate-lead titanate ($Pb[Mg_{1/3}Nb_{2/3}]O_3$—$PbTiO_3$ or PMN-PT) and lead magnesium niobate-lead zirconate titanate ($Pb[Mg_{1/3}Nb_{2/3}]O_3$—$Pb[Zr_{1-x}Ti_x]O_3$ or PMN-PZT) of rhombohedral, morphotropic phase boundary and adjacent tetragonal compositions and their doped and/or modified ternary and quaternary derivative; and
   wherein said piezoelectric single crystal active elements are bonded with epoxy with said edge stiffeners and washer stiffeners composed of polymeric, metallic or ceramic material.

2. The multi-stake actuator as claimed in claim 1, wherein each piezoelectric single crystal active element is made of multiple of single crystals of compositions and cuts described in claim 1 bonded back-to-back.

3. The multi-stake actuator as claimed in claim 1, wherein the shaped edge and washer stiffeners placed in between adjacent piezoelectric single crystal active elements configure the multi-stake actuator into cross-sections selected from a group consisting of triangular, square, rectangular, hexagonal, octagonal and other odd and even sided pseudo-ring polygon configurations.

4. The multi-stake actuator as claimed in claim 3, wherein inner corners of the single crystals are beveled to enable the piezoelectric single crystal active elements to fit into a desired configuration with one of shaped edge stiffeners of reduced cross-section and without any shaped edge stiffeners.

5. The multi-stake actuator as claimed in claim 1, wherein both end washer stiffeners contain a central hole to enable the multi-stake actuator to function like a ring or cylinder actuator.

6. The multi-stake actuator as claimed in claim 5, wherein both end washer stiffeners are solid pieces and function as end caps, and at least one of said end caps is hemispherically shaped to minimize its deflection deformation and to minimize possible bending load imposed onto the single crystal active elements during use.

7. The multi-stake actuator as claimed in claim 1, wherein an intermediate washer stiffener separates the length of the single crystal active materials into two equal or unequal halves, to limit the use of long pieces of single crystal active element which could make the device fragile.

8. The multi stake actuator as claimed in claim 7, wherein the top and bottom stakes are of different designs and configurations including the number and arrangement of the single crystals, their compositions, cut and dimensions to serve for various application needs.

9. The multi-stake actuator as claimed in claim 1, wherein the washers are electrically insulated from the crystals through an appropriate surface treatment or a thin hard insulation layer bonded onto the bonding face.

10. The multi-stake actuator as claimed in claim 1, wherein pre-stress mechanisms include a combination of a stressed rod, springs and lock nuts incorporated to load the single crystals and epoxy joints in compression to improve the robustness and reliability of the actuator.

11. Any derivative device in which at least one multi-stake actuator as claimed in claim 1 is used as a means of displacement actuation.

* * * * *

UNITED STATES PATENT AND TRADEMARK OFFICE
CERTIFICATE OF CORRECTION

PATENT NO. : 9,673,374 B2  
APPLICATION NO. : 14/370051  
DATED : June 6, 2017  
INVENTOR(S) : Yuexue Xia, Huilin Nelly Goh and Dian-Hua Lin Page 1 of 1

It is certified that error appears in the above-identified patent and that said Letters Patent is hereby corrected as shown below:

In the Claims

Column 9, Claim 2, Line 32, please delete "multiple of single" and insert --multiple single--.

Signed and Sealed this  
Fifth Day of September, 2017

Joseph Matal  
*Performing the Functions and Duties of the*  
*Under Secretary of Commerce for Intellectual Property and*  
*Director of the United States Patent and Trademark Office*